(12) United States Patent
Lai

(10) Patent No.: US 7,358,536 B2
(45) Date of Patent: Apr. 15, 2008

(54) ACTIVE MATRIX SUBSTRATE

(75) Inventor: Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 208 days.

(21) Appl. No.: 11/162,644

(22) Filed: Sep. 18, 2005

(65) Prior Publication Data
US 2007/0007523 A1    Jan. 11, 2007

(30) Foreign Application Priority Data
Jul. 7, 2005    (TW) ............................... 94122970 A

(51) Int. Cl.
*H01L 29/18*    (2006.01)
*H01L 33/00*    (2006.01)

(52) U.S. Cl. .................. 257/88; 257/E33.001; 438/30; 438/34

(58) Field of Classification Search .................. 257/88, 257/E33.001; 438/30, 34
See application file for complete search history.

(56) References Cited

U.S. PATENT DOCUMENTS

| | | | | |
|---|---|---|---|---|
| 5,019,002 A * | 5/1991 | Holmberg | ..................... | 445/24 |
| 6,175,394 B1 * | 1/2001 | Wu et al. | ..................... | 349/40 |
| 6,611,407 B1 * | 8/2003 | Chang | ......................... | 361/56 |
| 6,696,701 B2 * | 2/2004 | Hector et al. | .................. | 257/72 |
| 2003/0107424 A1 * | 6/2003 | Huang | ......................... | 327/310 |
| 2005/0264964 A1 * | 12/2005 | Coronel et al. | ................ | 361/56 |
| 2006/0065931 A1 * | 3/2006 | Lee et al. | .................... | 257/355 |
| 2006/0278929 A1 * | 12/2006 | Liu et al. | ..................... | 257/360 |

FOREIGN PATENT DOCUMENTS

| | | | |
|---|---|---|---|
| JP | 2003-107582 | | 4/2003 |
| JP | 2005260263 A | * | 9/2005 |
| JP | 2006018275 A | * | 1/2006 |

* cited by examiner

*Primary Examiner*—Michelle Estrada
(74) *Attorney, Agent, or Firm*—Jianq Chyun IP Office

(57) ABSTRACT

An active matrix substrate includes a substrate, pixel units, driving lines, and an electrostatic discharge protection circuit. The substrate has an active region and a peripheral region. The pixel units are arranged to form a matrix inside the active region. The driving lines are inside the active region and the peripheral region, and electrically connected to pixel units. The ESD protection circuit is inside the peripheral region of the substrate and electrically connected to the pixel units. Furthermore, the ESD protection circuit includes a first conductive line, a second conductive line, first protective elements, and second protective elements. The first protective elements are between the first conductive line and the second conductive line, and are electrically connected to corresponding driving lines. The second protective elements are adjacent to the outer-most driving line and electrically connected to the first and the second conductive line for protecting the outermost driving line.

7 Claims, 6 Drawing Sheets

ACTIVE MATRIX SUBSTRATE

CROSS-REFERENCE TO RELATED APPLICATION

This application claims the priority benefit of Taiwan application serial no. 94122970, filed on Jul. 7, 2005. All disclosure of the Taiwan application is incorporated herein by reference.

BACKGROUND OF THE INVENTION

1. Field of the Invention

The present invention relates to a liquid crystal display. More particularly, the present invention relates to an active matrix substrate having an electrostatic discharge (ESD) protection circuit.

2. Description of the Related Art

The electrostatic discharge phenomenon is found almost everywhere. Due to electronic affinity or repulsion between different types of objects, the process of separating of two objects after bringing into contact with each other easily leads to a charge transfer between the objects. Once an amount of electric charges has been accumulated to produce a charged object, an instant charge transfer to a second object having a different potential occurs when the charged body is in contact with or is brought near the second object. This is the so-called "electrostatic discharge" (ESD).

In general, the probability of receiving damage from electrostatic discharge through the manufacturing, assembly, and transportation processes or even in normal use by the consumer is relatively high. Therefore, it is important for an electronic product to have a design for protection against electrostatic discharge so that the product has a longer life span. In particular, the damage due to an electrostatic discharge in a product fabricated using advanced semiconductor production technologies such as integrated circuit (IC) or flat panel display can be easily prone. This is because the components inside the semiconductor product have very small dimensions so that the damaging effect caused by a transient high voltage ESD on the circuits inside the integrated circuit or flat panel display is permanent. Ultimately, the device simply malfunctions and is scrapped.

For the existing flat panel display, an electrostatic discharge often leads to the production of dot defects or line defects on the display panel. Because of difficulties in the absolute prevention of electrostatic discharge during the process of fabricating a flat panel display, the conventional technique often relies on an electrostatic discharge (ESD) protection circuit inside the flat panel display to minimize the damages inflicted upon the display due to possible ESD. At the present, the most common ESD protection circuit used inside the flat panel display includes an inner short ring (ISR) and an outer short ring (OSR). However, the combination of the inner short ring and the outer short ring could hardly protect the first data line or the ones close to the first data line and the last data line or the ones close to the last data line if the discharge voltage is excessively high. Therefore, the ones close to the first or the ones close to the last data lines are more vulnerable to damages caused by an ESD, and consequently these lines have more line defects.

SUMMARY OF THE INVENTION

Accordingly, at least one objective of the present invention is for providing an active matrix substrate equipped with an improved electrostatic discharge protection device.

To achieve these and other advantages and in accordance with the purpose of the invention, as embodied and broadly described herein, the invention provides an active matrix substrate including a substrate, a plurality of pixel units, a plurality of driving lines, and an electrostatic discharge (ESD) protection circuit. The substrate has an active region and a peripheral region next to the active region. The pixel units are arranged to form a matrix inside the active region of the substrate. The driving lines are disposed inside the active region and the peripheral region, and they are electrically connected to the pixel units. The ESD protection circuit is disposed inside the peripheral region of the substrate, and it is electrically connected to the pixel units. Furthermore, the ESD protection circuit includes a first conductive line, a second conductive line, sets of first protective elements, and a set of second protective elements. The second conductive line is disposed between the pixel units and the first conductive line. The set of first protective elements is disposed between the first conductive line and the second conductive line, and each set of the first protective elements is electrically connected to a corresponding driving line. The set of second protective elements is disposed adjacent to the outermost driving line and is electrically connected to the first conductive line and the second conductive line for protecting the outermost driving line.

In one embodiment of the present invention, the active matrix substrate further includes an electrostatic charge releasing line, such as a common line, so that the first conductive line and the second conductive line are electrically connected to the electrostatic charge releasing line.

In one embodiment of the present invention, the pixel units further includes a plurality of active devices and a plurality of pixel electrodes. The active devices are electrically connected to the corresponding driving lines, and the pixel electrodes are electrically connected to the corresponding active devices.

In one embodiment of the present invention, the first protective element is a diode having a floating gate, a thin film transistor, a capacitor, or an assembly containing a diode and a thin film transistor.

In one embodiment of the present invention, the second protective element is a diode having a floating gate, a thin film transistor, a capacitor, or an assembly containing a diode and a thin film transistor.

The active matrix substrate of the present invention has an electrostatic discharge protection circuit disposed on it. The electrostatic discharge protection circuit can protect the active matrix substrate against possible damages to its internal circuit due to electrostatic discharge, thereby increasing the production yield of the active matrix substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE REFERRED EMBODIMENTS

Figure 1:
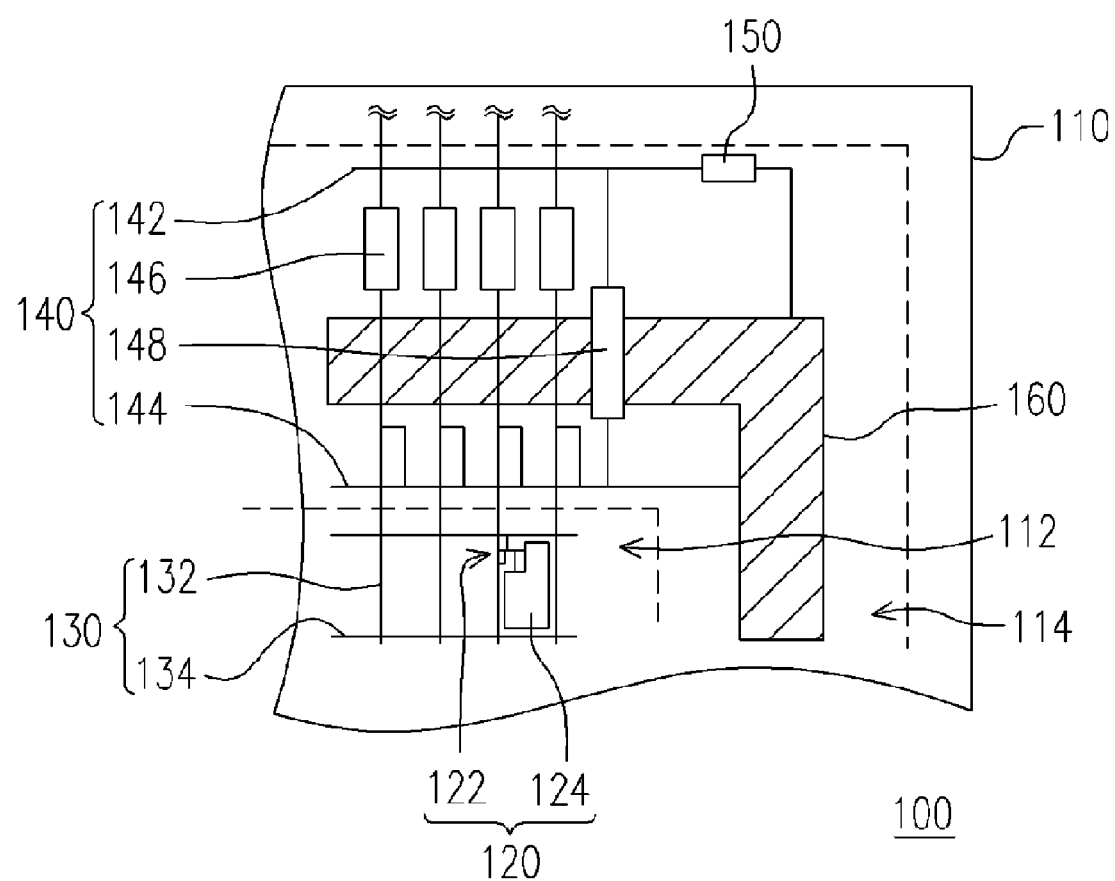
FIG. 1 is a top view illustrating a portion of an active matrix substrate, according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a top view illustrating a portion of an active matrix substrate, according to a first embodiment of the present invention. As shown in FIG. 1, the active matrix substrate 100 includes a substrate 110, a plurality of pixel units 120, a plurality of driving lines 130, and an electrostatic discharge (ESD) protection circuit 140. The substrate 110 has an active region 112 and a peripheral region 114 disposed adjacent to each other. The pixel units 120 are arranged to form a matrix on the substrate 110 within the active region 112. The driving lines 130 are disposed inside the active region 112 of the substrate 110 and the peripheral region 114. The ESD protection circuit 140 is disposed inside the peripheral region 114 of the substrate 110 and is electrically connected to the pixel units 120. More specifically, the ESD protection circuit 140 includes a first conductive line 142, a second conductive line 144, a plurality of sets of first protective elements 146, and a set of second protective elements 148. The second conductive line 144 is disposed between the pixel units 120 and the first conductive line 142. The sets of first protective elements 146 are disposed between the first conductive line 142 and the second conductive line 144. Furthermore, each set of first protective elements 146 is connected to the driving line 130 in a one-to-one basis. In addition, the set of second protective elements 148 is disposed adjacent to the outermost driving line 130. Moreover, the set of second protective elements 148 is connected to the first conductive line 142 and the second conductive line 144 for protecting the outermost driving line 130.

In the present embodiment, the driving lines 130 inside the active region 112 are sub-divided into a plurality of scan lines 134 and a plurality of data lines 132 according to their locations and characteristics. In the active matrix substrate 100, each pixel unit 120 includes an active device 122 and a pixel electrode 124. Furthermore, each active device 122 is electrically connected to a corresponding scan line 134 and a corresponding data line 132. Additionally, the pixel electrode 124 is connected electrically with the active device 122.

In the present embodiment, the substrate 110 is fabricated using glass, and the driving lines 130 is fabricated using a metal with good electrical conductivity. The pixel electrode 124 is fabricated using indium-tin oxide (ITO), indium-zinc oxide (IZO), or other transparent conductive materials. The active device 122 is a thin film transistor or other tri-polar active devices.

However, the aforementioned active matrix substrate 100 may also include a dissipation resistor 150 and an electrostatic charge releasing line 160. The dissipation resistor 150 and the electrostatic discharge releasing line 160 are disposed inside the peripheral region 114. For example, the dissipation resistor 150 is implemented through a meandering circuit and connected to the first conductive line 142. The dissipation resistor 150 is also a diode. The electrostatic discharge releasing line 160 is a common line coupled to a common voltage and is connected electrically with the sets of first protective elements 146 and the set of second protective elements 148. In the present embodiment, each of the set of first protective elements 146 includes a diode with a floating gate, a thin film transistor, a capacitor, or a combination of the above devices. Hence, the sets of first protective elements 146 in the ESD protection circuit 140 is served as the switching elements for electrostatic discharge pathways.

Figure 2:
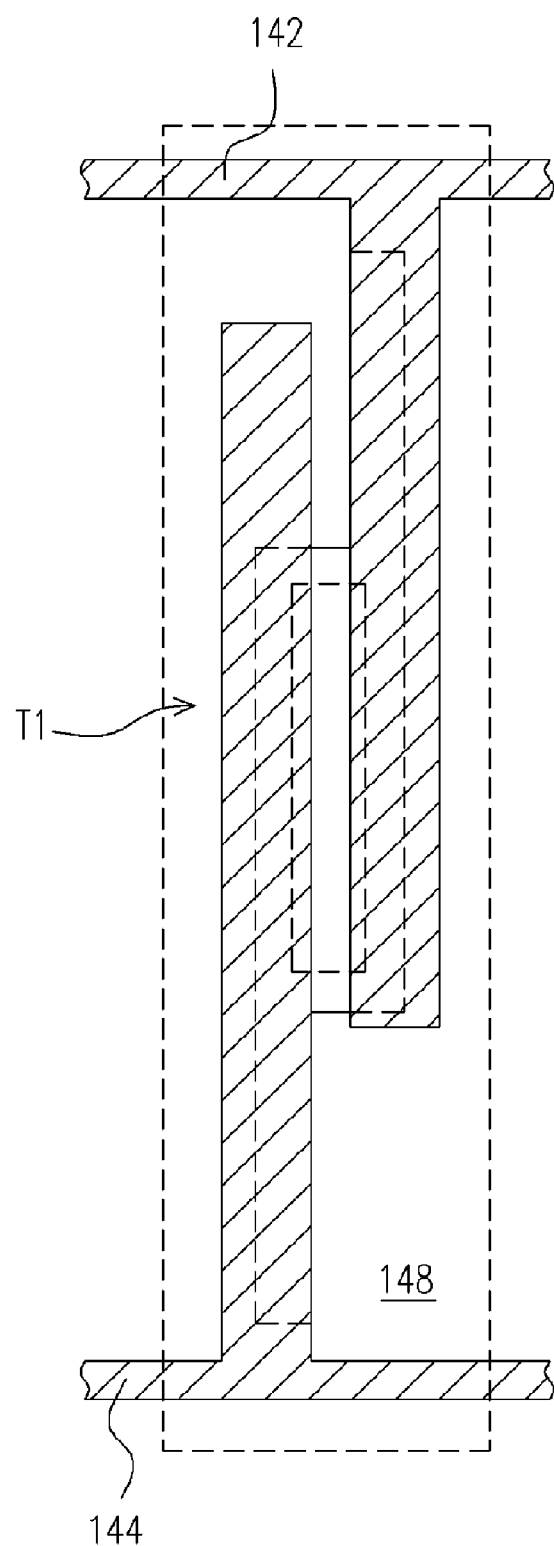
FIG. 2 is a top view illustrating a second protective element in the first embodiment of the present invention.

FIG. 2 is a top view illustrating the second protective element in the first embodiment of the present invention. As shown in FIGS. 1 and 2, the set of second protective elements 148 is electrically connected to the sets of first protective elements 146 through the first conductive line 142 and the second conductive line 144. In the present embodiment, the set of second protective elements 148 is a thin film transistor T1. When an electrostatic discharge occurs in the active matrix substrate 100, the charges are channeled into the electrostatic discharge releasing line 160 through the first conductive line 142, the second conductive line 144, the set of first protective elements 146, and the set of second protective elements 148. In other words, when an electrostatic discharge is occurred, the outermost driving line (the last data line 132) obtains more protection because the set of second protective elements 148 (the thin film transistor T1) provides another route for releasing the electric charges. More specifically, as the static charges are channeled to the thin film transistor T1, the thin film transistor T1 is switched on to guide the static charges into the electrostatic discharge releasing line 160 for discharge. Consequently, serious damage to the active matrix substrate 100 due to an electrostatic discharge is averted.

Figure 3:
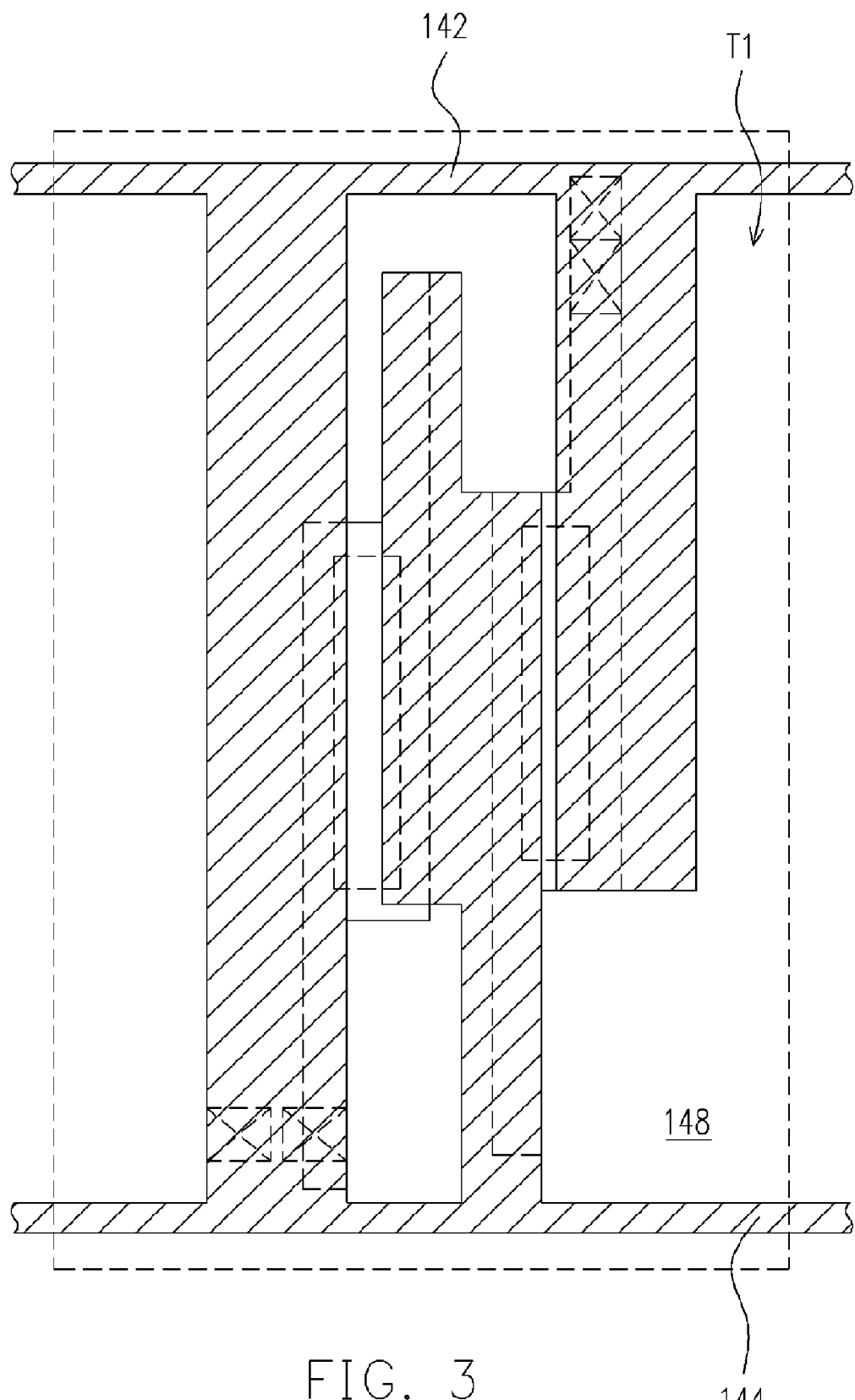
FIG. 3 is a top view illustrating another second protective element in the first embodiment of the present invention.

To increase the protection capacity of the ESD protection circuit 140 on the active matrix substrate 100, the set of second protective elements 148 is made up of a plurality of thin film transistors T1 as shown in FIG. 3.

The main components and the corresponding interconnecting relationship in the active matrix substrate 100 according to the second embodiment of the present invention is very similar to the first embodiment. Thus, only the major differences between the two embodiments are described while a description of the identical components and interconnecting relationships are omitted.

Figure 4A:
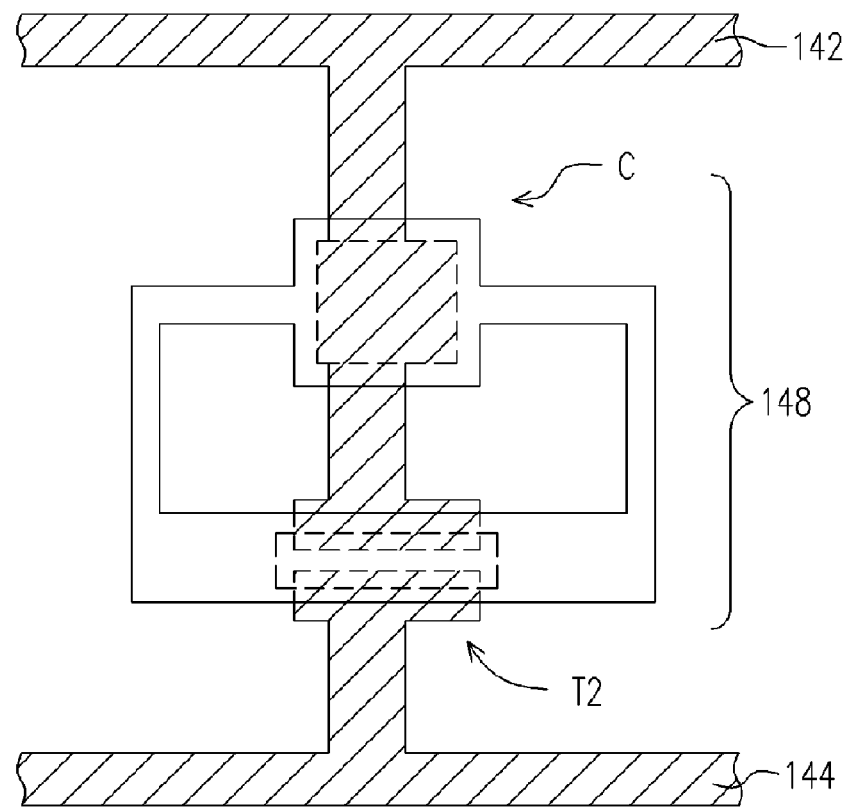
FIG. 4A is a top view illustrating the second protective element according to a second embodiment of the present invention.
Figure 4B:
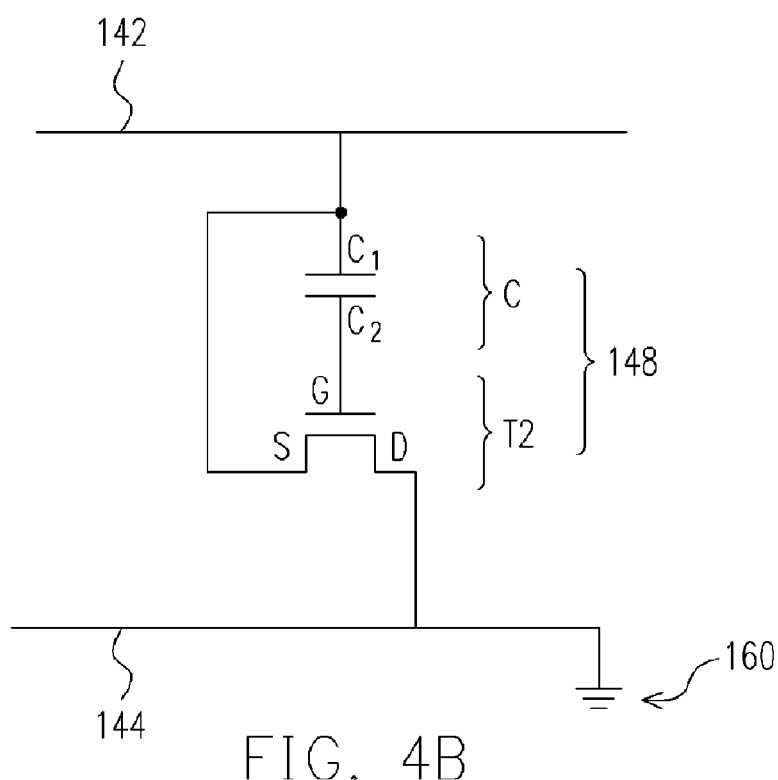
FIG. 4B is an equivalent circuit diagram of FIG. 4A.

FIG. 4A is a top view illustrating the second protective element according to a second embodiment of the present invention. FIG. 4B is an equivalent circuit diagram of FIG. 4A. As shown in FIGS. 1, 4A and 4B, the set of second protective elements 148 in the present embodiment differs slightly from that of the first embodiment. The set of second protective elements 148 in the present embodiment includes a thin film transistor T2 and a capacitor C. The capacitor C has a first electrode C1 and a second electrode C2. And the thin film transistor T2 has a gate G, a source S, and a drain D. Furthermore, the capacitor C and the thin film transistor T2 are electrically connected. When there is an electrostatic discharge in the active matrix substrate 100, the electric charges is channeled into the electrostatic discharge releasing line 160 via the first conductive line 142, the first protective elements 146, the protective elements 148, and the second conductive line 144. Therefore, the active matrix substrate 100 is prevented from damages. In other words, as electrostatic discharge occurs, the second protective elements 148 (the capacitor C and the thin film transistor T2) is able to provide a pathway for releasing static charges. Therefore, the outermost driving line 130 (in the vicinity of the last data line 132) obtains a better discharge protection.

More specifically, the first electrode C1 of the electrode C and the first conductive line 142 is electrically connected to the source S of the thin film transistor T2. Furthermore, the second electrode C2 is coupled to the gate G of the thin film transistor T2 and the drain D is connected to the second conductive line 144. When there is an electrostatic discharge on the active matrix substrate 100, the static charges are channeled into the first electrode C1 of the capacitor C through the first conductive line 142 so that the first electrode C1 is sustained in a high voltage state. Meanwhile, the voltages of the second electrode C2 and the gate G electrically coupled to the second electrode C2 are upward coupled. When the voltage of the gate G rises to the threshold voltage of the thin film transistor T2, the thin film transistor T2 is switched on. Thereafter, static charges are passed through the channel layer (not shown) of the thin film transistor T2 and channel into the static charge releasing line 160 for discharge. Consequently, the damaging effect of any electrostatic discharge in the active matrix substrate 100 is minimized.

Figure 5:
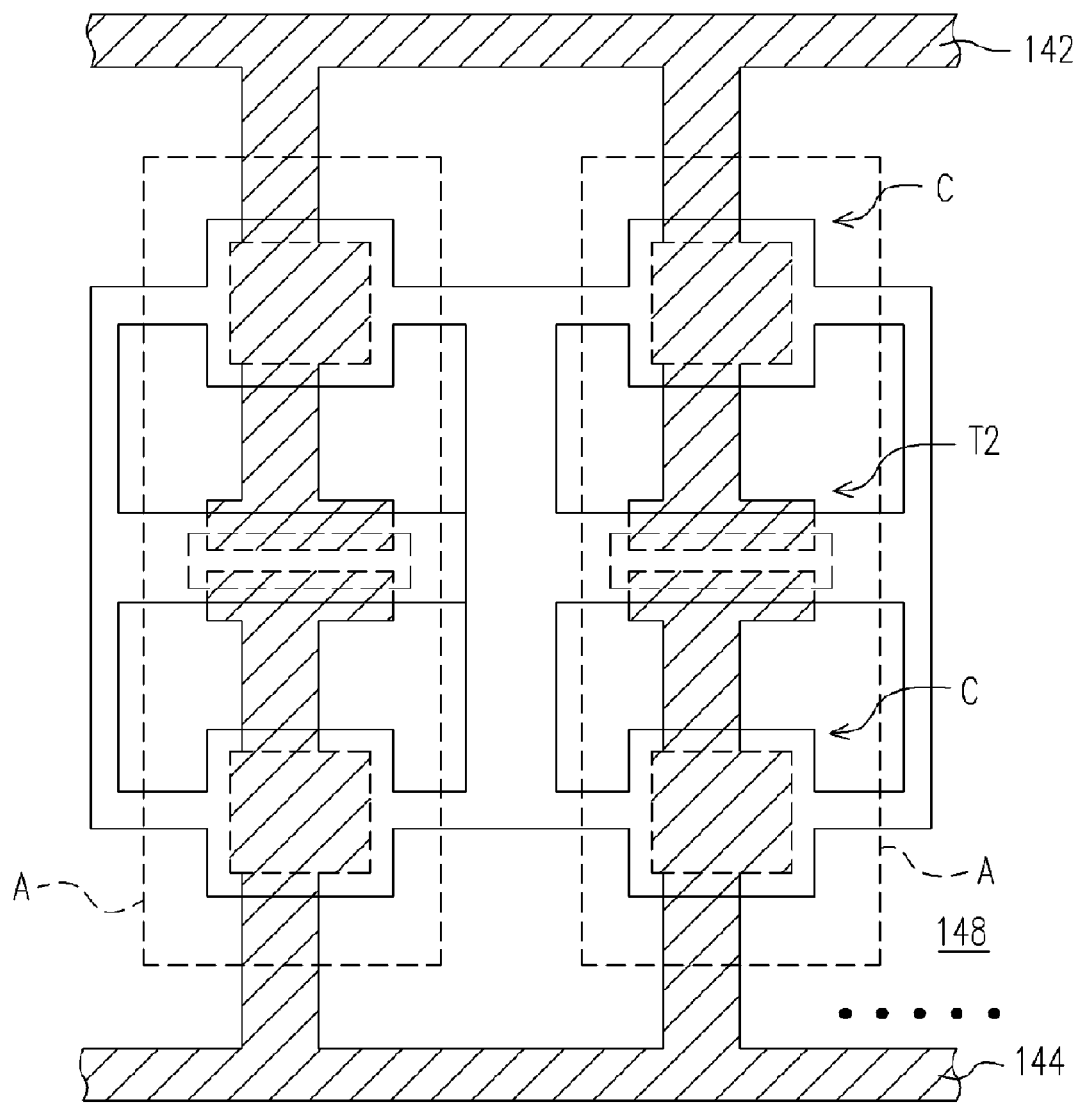
FIG. 5 is a top view illustrating the second protective element according to the second embodiment of the present invention.

Furthermore, to enhance the protection capacity of the ESD protection circuit 140, the second protective elements 148 in the present invention is not limited to a single thin film transistor T2 and a capacitor C. For example, as shown in the 'A' portion in FIG. 5, the second protective elements 148 in the present invention include a thin film transistor T2 and a plurality of capacitors C serially connected. In addition, the second protective elements 148 in the present invention also include a plurality of the parallel connected 'A' portions (as shown in FIG. 5). Moreover, the thin film transistor T2 and/or the capacitor C forming the second protective elements 148 are replaced by diodes.

Figure 6:
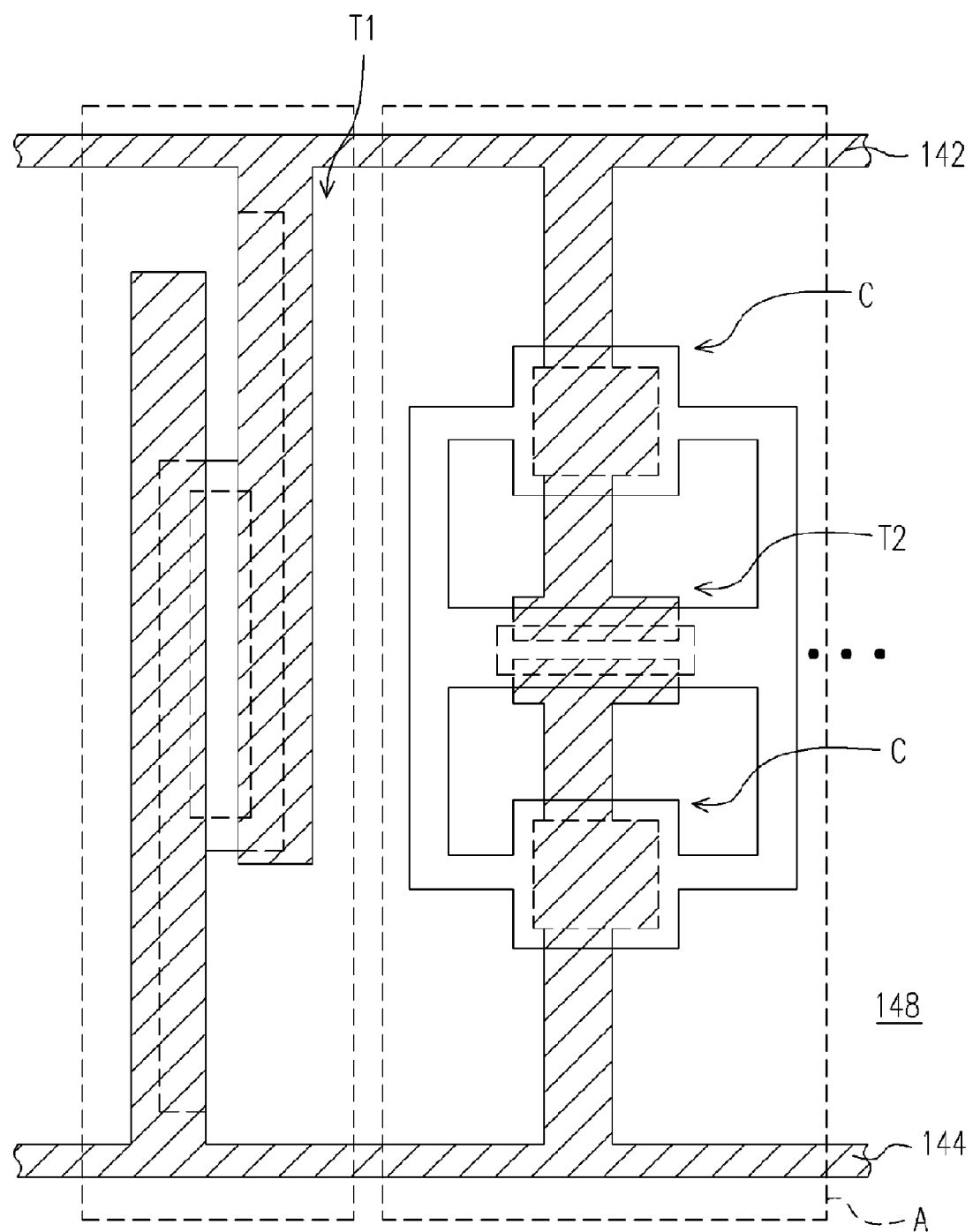
FIG. 6 is a top view illustrating the second protective element according to a third embodiment of the present invention.

It should be noted that the aforementioned first and second embodiment should be regarded as examples only. There is no particular limitation on the device types, the number of devices, or the serial-parallel interconnecting mode of the devices. For example, as shown in FIG. 6, the second protective elements 148 includes the thin film transistor T1 described in the first embodiment and the parallel connected 'A' portion described in the second embodiment.

In summary, a set of second protective elements 148 is disposed adjacent to the outermost driving line 130 inside the electrostatic discharge protection circuit in the active matrix substrate of the present invention. Furthermore, the second protective elements 148 are electrically connected to the driving line 130 through the first conductive line 142 and the second conductive line 144. When there is an electrostatic discharge on the active matrix substrate, the second protective elements 148 provides the active matrix substrate with a subsidiary electric charge-channeling pipeline. Hence, the second protective element 148 assists the first protective elements 146 to channel the electric charges to the electrostatic discharge releasing line. Ultimately, the damaging effect on the outermost driving line 130 of the active matrix substrate due to an electrostatic discharge can be avoided and the production yield of the active matrix substrate is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active matrix substrate, comprising:
   a substrate having an active region and a peripheral region, wherein the peripheral region and the active region are disposed adjacent to each other;
   a plurality of pixel units arranged to form a matrix within the active region of the substrate;
   a plurality of driving lines disposed in the active region and the peripheral region and are electrically connected to the pixel units;
   an electrostatic discharge protection circuit disposed on the substrate within the peripheral region, wherein the electrostatic discharge protection circuit is electrically connected to the pixel units, and the electrostatic discharge protection circuit further comprises:
   a first conductive line;
   a second conductive line disposed between the pixel units and the first conductive line;
   a plurality of sets of first protective elements disposed between the first conductive line and the second conductive line, wherein each set of first protective elements is connected to a corresponding driving line; and
   a set of second protective elements disposed adjacent to the outermost driving line, wherein the set of second protective elements are connected to the first conductive line and the second conductive line.

2. The active matrix substrate of claim 1, wherein the substrate further comprises an electrostatic discharge releasing line disposed on the substrate within the peripheral region such that the electrostatic discharge releasing line is electrically connected to the first conductive line and the second conductive line.

3. The active matrix substrate of claim 2, wherein the electrostatic discharge releasing line is a common line.

4. The active matrix substrate of claim 1, wherein the pixel units comprises:
   a plurality of active devices electrically connected to the corresponding driving lines; and
   a plurality of pixel electrodes electrically connected to the corresponding active devices.

5. The active matrix substrate of claim 1, wherein each set of first protective element includes a diode, a thin film transistor, a capacitor, or combinations thereof.

6. The active matrix substrate of claim 5, wherein each set of first protective element includes a floating gate.

7. The active matrix substrate of claim 1, wherein the set of second protective element includes a diode, a thin film transistor, a capacitor, or combinations thereof.

* * * * *